United States Patent
David et al.

(10) Patent No.: US 7,887,889 B2
(45) Date of Patent: *Feb. 15, 2011

(54) PLASMA FLUORINATION TREATMENT OF POROUS MATERIALS

(75) Inventors: Moses M. David, Woodbury, MN (US); Gina M. Buccellato, Eagan, MN (US); John S. Huberty, St. Paul, MN (US); Seth M. Kirk, Minnepolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/293,830

(22) Filed: Nov. 13, 2002

(65) Prior Publication Data

US 2003/0134515 A1 Jul. 17, 2003

Related U.S. Application Data

(60) Provisional application No. 60/341,564, filed on Dec. 14, 2001.

(51) Int. Cl.
*C08J 7/18* (2006.01)
*H05H 1/46* (2006.01)

(52) U.S. Cl. .............. 427/490; 427/491; 427/536; 427/538; 427/569; 427/577

(58) Field of Classification Search ............ None
See application file for complete search history.

(56) References Cited

U.S. PATENT DOCUMENTS

| | | | | |
|---|---|---|---|---|
| 4,594,079 A | * | 6/1986 | Yamamoto et al. | 96/13 |
| 4,601,911 A | * | 7/1986 | Ueno et al. | 427/538 |
| 4,718,907 A | * | 1/1988 | Karwoski et al. | 623/23.71 |
| 4,824,444 A | * | 4/1989 | Nomura | 95/54 |
| 4,900,625 A | * | 2/1990 | Kondo et al. | 428/383 |
| 4,946,903 A | | 8/1990 | Gardella, Jr. et al. | |
| 5,034,265 A | * | 7/1991 | Hoffman et al. | 442/126 |
| 5,102,738 A | | 4/1992 | Bell et al. | |
| 5,437,900 A | | 8/1995 | Kuzowski | |
| 5,439,736 A | * | 8/1995 | Nomura | 428/308.4 |
| 5,463,010 A | * | 10/1995 | Hu et al. | 528/25 |
| 5,627,079 A | * | 5/1997 | Gardella et al. | 436/525 |
| 5,705,225 A | * | 1/1998 | Dornfest et al. | 427/248.1 |
| 5,773,098 A | | 6/1998 | Thomas | |
| 6,197,120 B1 | | 3/2001 | David | |
| 6,358,569 B1 | * | 3/2002 | Badyal et al. | 427/490 |
| 6,441,553 B1 | * | 8/2002 | Yializis et al. | 315/111.21 |
| 6,558,409 B1 | * | 5/2003 | Roby | 606/222 |
| 6,603,121 B2 | * | 8/2003 | Grace et al. | 250/324 |
| 6,878,419 B2 | * | 4/2005 | David et al. | 427/535 |

(Continued)

FOREIGN PATENT DOCUMENTS

EP 0 710 739 B1 5/1996

(Continued)

*Primary Examiner*—Marianne L Padgett
(74) *Attorney, Agent, or Firm*—Karl G. Hanson

(57) ABSTRACT

The application discloses articles and methods of plasma fluorination treatment that employ a capacitively-coupled system to fluorinate porous articles. The methods include placing the article to be treated within an ion sheath adjacent to an electrode and placing the article to be treated between powered and grounded electrodes separated by about 25 mm or less.

10 Claims, 1 Drawing Sheet

U.S. PATENT DOCUMENTS

| | | | |
|---|---|---|---|
| 7,125,603 B2 * | 10/2006 | David et al. | 428/304.4 |
| 2004/0058056 A1 * | 3/2004 | Osaki et al. | 427/2.1 |
| 2005/0181198 A1 * | 8/2005 | David et al. | 428/304.4 |
| 2007/0141580 A1 * | 6/2007 | David et al. | 435/6 |
| 2010/0178468 A1 * | 7/2010 | Jiang et al. | 428/164 |

FOREIGN PATENT DOCUMENTS

| | | |
|---|---|---|
| EP | 0 985 741 A1 | 3/2000 |
| JP | 03-284325 A * | 12/1991 |
| JP | 2001068452 | 3/2001 |
| WO | WO 96/27044 | 9/1996 |
| WO | WO 99/22635 | 5/1999 |
| WO | WO 99/28530 | 6/1999 |
| WO | WO 00/01737 | 1/2000 |
| WO | WO 00/16913 | 3/2000 |
| WO | WO 00/16914 | 3/2000 |
| WO | WO 01/07144 A1 | 2/2001 |

* cited by examiner

PLASMA FLUORINATION TREATMENT OF POROUS MATERIALS

CROSS REFERENCE TO RELATED APPLICATION

This application claims priority to U.S. Provisional Patent Application No. 60/341,564, Filed Dec. 14, 2001, which is incorporated by reference.

BACKGROUND

Plasma-deposited fluorocarbon coatings can impart desirable properties, such as low surface energy, water-repellency, soil resistance, and durability, to a treated article. A charge can be imparted to the treated article, which makes the article suitable for use in items such as aerosol filters, face masks, air filters, and electrostatic elements in electro-acoustical devices such as microphones, headphones, and electrostatic recorders. Accordingly, plasma fluorination methods that can quickly and efficiently produce an article with a fluorocarbon coating are desired.

SUMMARY OF INVENTION

One aspect of the present invention features a plasma fluorination method to fluorinate porous articles, both on the surface and in the interior. It also features the resulting articles.

One aspect of the present invention is a method of fluorinating a porous article comprising: providing a reaction chamber having a capacitively-coupled system comprising at least one grounded electrode and at least one electrode powered by an RF source; generating a fluorine-containing plasma in the chamber thereby causing an ion sheath to form adjacent to the electrodes; placing a porous article in the ion sheath of the powered electrode; and allowing reactive species from the plasma to react with the article surface and interior whereby the article becomes fluorinated.

Another aspect of the present invention is a method of fluorinating a porous article comprising: providing a reaction chamber having a capacitively-coupled system comprising at least one electrode powered by an RF source and at least one grounded electrode that is substantially parallel to the surface of the powered electrode and separated from the grounded electrode by about 25 millimeters or less; generating a fluorine-containing plasma in the chamber at a pressure of about 40 Pascal or less; placing a porous article between the substantially parallel electrodes and outside of the ion sheath; and allowing reactive species from the plasma to react with the article surface and interior for a total treatment time of over two minutes whereby the article becomes fluorinated.

Another aspect of the present invention is a method of fluorinating a porous article comprising: providing a reaction chamber having a capacitively-coupled system comprising at least one electrode powered by an RF source and at least one grounded electrode that is substantially parallel to the surface of the powered electrode and separated from the grounded electrode by about 25 millimeters or less; generating a fluorine-containing plasma in the chamber thereby causing an ion sheath to form adjacent to the electrodes; placing a porous article in the ion sheath of the grounded electrode; and allowing reactive species from the plasma to react with the article surface and interior for a total treatment time of about 30 seconds to about 5 minutes whereby the article becomes fluorinated.

Another aspect of the present invention is a method of fluorinating a porous article comprising: providing a reaction chamber having a capacitively-coupled system comprising at least one electrode powered by an RF source and at least one grounded electrode that is substantially parallel to the surface of the powered electrode and separated from the grounded electrode by about 13 millimeters or less; generating a fluorine-containing plasma in the chamber thereby causing an ion sheath to form adjacent to the electrodes; placing a porous article between the electrodes; and allowing reactive species from the plasma to react with the article surface and interior whereby the article becomes fluorinated.

The methods may include embodiments wherein the process is continuous and/or wherein the treatment time is less than about 60 seconds.

The porous article to be treated may be selected from the group consisting of foams, woven materials, nonwoven materials, membranes, frits, porous fibers, textiles, and microporous articles. The article may have pores smaller that the mean free path of any species in the plasma. The article may have two parallel major surfaces and may be treated on one or both major surface.

The methods may be carried out with the electrodes separated by about 25 millimeters or less. In some embodiments, the electrodes are separated boy about 16 millimeters(mm) or about 13 mm. Another aspect of the invention is an article comprising at least one fluorinated porous layer having a basis weight of about 10 to about 300 gsm and a thickness of about 0.20 to about 20 mm, wherein the layer has a $Q_{200}$ of greater than about 1.1. The layer may have an effective fiber diameter of about 1 to about 50 μm.

Another aspect of the invention is an article comprising a composite layer comprising a non-fluorine containing porous layer and a plasma fluorinated layer affixed to the surface and interior of the porous layer, wherein the composite layer has at least 3700 ppm fluorine or, in another embodiment, at least 5000 ppm.

Another aspect of the invention is an apparatus for fluorinating a substrate comprising a vacuum chamber, a capacitively-coupled system within the chamber comprising at least one electrode powered by an RF source and at least one grounded electrode substantially parallel to the powered electrode wherein the electrodes are separated by about 25 mm or less, e.g., about 16 mm or 13 mm, and a means for generating a fluorine-containing plasma throughout the entire chamber.

The powered electrode may comprise one or more rotating drums. The apparatus can comprise an asymmetric parallel plate reactor.

As used in this invention:

"microporous membrane" means a membrane having pore sizes with a lower limit of about 0.05 μm and an upper limit of about 1.5 μm;

"plasma fluorocarbon" means a material deposited from a plasma comprising fluorocarbon species;

"plasma fluorination" means thin film deposition, surface modification, and any other plasma-induced chemical or physical reaction that can fluorinate an article;

"porous article" means an article having pathways open to at least one surface;

"$Q_{200}$" means the quality factor rating of a filter; the procedure for determining $Q_{200}$ is set forth in the Examples section of this application, and "substantially parallel" means the electrodes are substantially the same distance from each other along their entire lengths, including concentric electrodes.

An advantage of at least one embodiment of the present invention is that it provides a continuous plasma fluorination method, which allows for efficient, i.e., faster, processing of articles, especially continuous articles, e.g., long sheets of material, as are used in roll-to-roll processing.

Another advantage of at least one embodiment of the invention is that it provides a durable fluorination treatment through the bulk of porous articles, including microporous membranes.

Another advantage of at least one embodiment of the present invention is that treatment efficiencies can be obtained by placing the article to be treated within an ion sheath.

Another advantage of at least one embodiment of the present invention is that fluorination efficiency may be achieved by reducing the space between the powered and grounded electrode to about 25 mm or less.

Other features and advantages of the invention will be apparent from the following drawings, detailed description, and claims.

DETAILED DESCRIPTION

Figure 1:
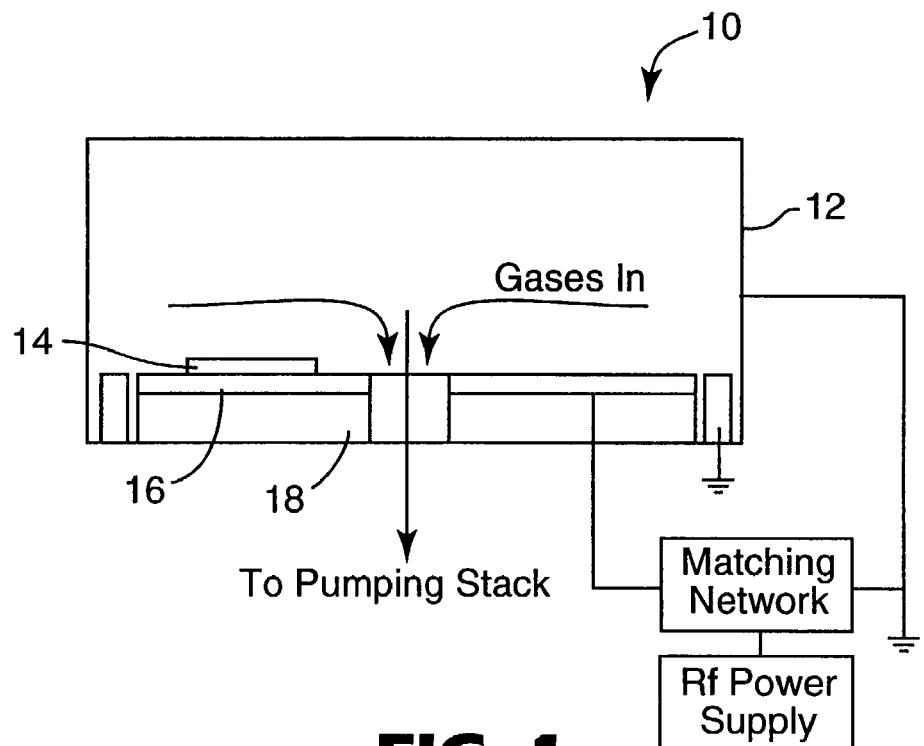
FIG. 1 depicts a parallel plate plasma apparatus for performing the plasma fluorination of the present invention.

The present invention provides a plasma fluorination method to fluorinate a porous article.

One method embodiment involves providing a reaction chamber having a capacitively-coupled electrode system wherein an ion sheath is formed adjacent to at least one electrode when a plasma is generated in the system. The ion sheath is an area adjacent to an electrode in which ion bombardment is prevalent. The porous article to be treated is placed within the ion sheath.

This method of the invention can be especially effective for articles with small pores because the ion sheath can force chemical species from the plasma into small pores of the articles being treated. This results in surprisingly fast fluorination of the pore interiors. It was not expected that plasma fluorination could be achieved within small pores, especially in cases where the pores are smaller than the mean free path of any species in the plasma.

The mean free path (MFP) for a particular species is the average distance traveled by a species before it collides with another species. The MFP depends in part on pressure because the proximity of species influences the collision frequency. For example, at 0.13 Pa (1 mTorr) and room temperature, the mean free path of an argon atom is 80 mm. See Brian Chapman, *Glow Discharge Processes*, 153 (John Wiley & Sons, New York 1980). Most other gases, including those used in the present invention, are within three times (i.e. 26-240 mm) of this value at this pressure. In the range of pressures useful for plasma fluorination, the mean free path of argon varies from 80 mm to 0.08 mm (or 80 microns). Other gases would have similar variations.

In plasma-treating a porous article, if the pore size is smaller than the mean free path of the species in the plasma (i.e., smaller than about 20 microns), normally the free radical species generated in the plasma will collide with the pore walls near the pore opening. The free radicals will react with molecules in the pore walls near the pore opening rather than traveling into the depths of the pores. Therefore, one would not expect the plasma fluorination to penetrate into the depths of the pores, especially when the pores have tortuous paths.

Another method embodiment of the present invention involves providing a reaction chamber having a capacitively-coupled electrode system in which a powered and grounded electrode are spaced about 25 mm (one inch), or less, apart and the porous article to be treated is suspended between the two electrodes and outside an ion sheath. In this embodiment, the chamber pressure is maintained at about 40 Pa or less and the total treatment time is over 2 minutes. This treatment method results in treated articles having a higher fluorine content, and better oil repellency, than similar articles treated in a system in which the grounded and powered electrode are farther apart and the chamber pressure is higher than about 40 Pa.

Another method embodiment of the present invention involves providing a reaction chamber having a capacitively-coupled system comprising at least one electrode powered by an RF source and at least one grounded electrode that is substantially parallel to the surface of the powered electrode and separated from the grounded electrode by about 25 millimeters or less; generating a fluorine-containing plasma in the chamber thereby causing an ion sheath to form adjacent to the electrodes; placing a porous article in the ion sheath of the grounded electrode; and allowing reactive species from the plasma to react with the article surface and interior for a total treatment time of about 30 seconds to about 5 minutes whereby the article becomes fluorinated.

Another method embodiment of the present invention involves providing a reaction chamber having a capacitively-coupled system comprising at least one electrode powered by an RF source and at least one grounded electrode that is substantially parallel to the surface of the powered electrode and separated from the grounded electrode by about 13 millimeters or less; generating a fluorine-containing plasma in the chamber thereby causing an ion sheath to form adjacent to the electrodes; placing a porous article between the electrodes; and allowing reactive species from the plasma to react with the article surface and interior whereby the article becomes fluorinated.

Porous Articles

Porous articles suitable for use in the present invention include foams, nonwoven materials, woven materials, membranes, frits, porous fibers, textiles, and microporous articles. These articles may have pore sizes of about 0.05 micrometers or greater.

The porous articles may be made from, e.g., polymers, metals, glasses, and ceramics. Suitable polymers for the above articles include polyolefins such as, e.g., polypropylene, polyethylene, poly-(4-methyl-1-pentene), and combinations thereof, halogenated vinylpolymers (e.g., polyvinyl chloride), polystyrene, polycarbonates, polyesters, polyamides, and combinations thereof. The nonwovens can be formed by a variety of methods, including but not limited to, carding, use of a rando-webber, spunbonding, hydrolacing, or blown microfibers. The textiles and cloths can be formed as nonwovens or as knit or woven materials. The textiles and cloths preferably have a basis weight in the range of about 10 to 500 grams per square meter more preferably about 15 to 300 grams per square meter. Porous frits synthesized from polymers, metals, glasses and ceramics are available commercially in various pore sizes. The pore size typically varies between 1 and 250 microns and the frits may have a void volume of between 20 and 80%. Typical applications of frits include filtration, support media for membrane cartridges, solvent filters, diffusers, fluidization supports, bio-barriers, nibs for writing instruments, chromatographic support media, catalysis support media, etc. Porous fibers are also commercially available. Typical diameters for these fibers are up to and around 100 µm and typical pore sizes are from about 0.001 µm (10 Å) to about 10 µm (1000 Å).

Suitable microporous films may be prepared by thermally-induced phase separation (TIPS) methods such as those described in U.S. Pat. No. 4,539,256 (Shipman), U.S. Pat. Nos. 4,726,989; 5,120,594 (Mrozinski); and U.S. Pat. No. 5,260,360 (Mrozinski et al.) which describe such films containing a multiplicity of spaced, randomly dispersed, equiaxed, nonuniform shaped particles of a thermoplastic polymer. These films typically have pore sizes with a lower limit of about 0.05 micrometers and an upper limit of about 1.5 micrometers.

A suitable porous material may have a basis weight of 10 to 300 gsm (grams per square meter) and a thickness of 0.20 to 20 mm. The porous material also may have an effective fiber diameter of 1 to 50 µm.

The porous articles can be any shape, e.g., sheets, rods, cylinders, etc., as long as they can be placed within an ion sheath that surrounds an electrode. Typically the articles will be sheet-like with two major parallel surfaces. The articles may be discrete articles or may be continuous sheets of material. They may have any level of hydrophobicity or hydrophilicity before they are treated.

The resulting fluorinated porous article may be used alone or may be incorporated into another article. For example, it may be incorporated into a multi-layer (two or more layers) article in which the other layer(s) are fluorinated or unfluorinated and are porous or nonporous. The multi-layer article may be made by any method known in the art, e.g., lamination, physical bonding, etc.

Porous filter media are frequently employed to filter air containing solid and/or liquid particles. The particles removed are often toxic or noxious substances. Scientists and engineers have long sought to improve filtration performance of air filters. Some of the most effective air filters use electret articles. Electrets are dielectric articles that exhibit a lasting charge, that is, a charge that is at least quasi-permanent. The term "quasi-permanent" means that the time constants characteristic for the decay of the charge are much longer than the time period over which the electret is used.

The charged nature of the electret enhances the filter's ability to attract and retain particles such as dust, dirt, and fibers that are present in the air. Electrets have been found to be useful in a variety of applications including air, furnace and respiratory filters, face masks, and electro-acoustic devices, such as microphones, headphones, and electrostatic recorders.

Over the years, various methods of making and improving the filtration performance of nonwoven fibrous electrets have been developed. These methods include, e.g., bombarding fibers with electrically charged particles as the fibers issue from a die orifice, corona charging a nonwoven fibrous web, and hydrocharging a nonwoven fibrous web.

While performance is enhanced through the use of electret charged media, degradation in filter efficiency during exposure or loading of aerosols containing an oily mist has been exhibited in some media. This change in performance during loading prompted the National Institute for Occupational Safety and Health (NIOSH) to specify testing that requires respirators used in oily mist environments to be exposed to 200 mg of dioctyl phthalate (DOP) during certification testing. In order to determine the benefits of the filters of this invention, the filter penetration was measured after exposing the sample to 200 mg of aerosolized DOP.

In addition to penetration, pressure drop of the filter is a key measurement in designing a filter. Pressure drop is defined as a reduction in static pressure within an air stream between the upstream and downstream sides of a filter through which the air stream passes. A lower pressure drop allows air to flow through the medium more easily. Lower pressure drop is typically preferred because it allows less effort or energy to be used to achieve the desired flow. This is true whether the filter is employed as a respirator, which a user breathes through; a battery powered air-purifying respirator; or a home furnace filter.

To ease the comparison and the design of filters, researchers often combine penetration and pressure drop into a single term of Quality Factor, i.e., the quality of the filtration performance of the material. In this application, quality factor is based on penetration and pressure drop after exposure to of 200 mg of dioctyl phthalate, as explained in more detail in the Examples section. The Quality Factor Rating is referred to as $Q_{200}$.

Some articles of the present invention have $Q_{200}$ ratings over 1.1, and in some cases, as high as 1.53. Some articles also have fluorine concentrations of over 3700 ppm, and in some cases, as high as 5000 ppm or more.

Apparatus

An apparatus suitable for the present invention provides a reaction chamber having a capacitively-coupled system with at least one electrode powered by an RF source and at least one grounded electrode. In some embodiments, a grounded electrode is separated from the powered electrode by about 25 mm or less.

A suitable reaction chamber is evacuable, has means for generating a fluorinated plasma throughout the entire chamber and is capable of maintaining conditions that produce plasma fluorination. That is, the chamber provides an environment which allows for the control of, among other things, pressure, the flow of various inert and reactive gases, voltage supplied to the powered electrode, strength of the electric field across the ion sheath, formation of a plasma containing reactive species, intensity of ion bombardment, and rate of deposition of a film from the reactive species. Aluminum is a preferred chamber material because it has a low sputter yield, which means that very little contamination occurs from the chamber surfaces. However, other suitable materials, such as graphite, copper, glass or stainless steel, may be used.

The electrode system may be symmetric or asymmetric. Preferred electrode surface area ratios between grounded and powered electrodes for an asymmetric system are from 2:1 to 4:1, and more preferably from 3:1 to 4:1. The ion sheath on the smaller powered electrode will increase as the ratio increases, but beyond a ratio of 4:1 little additional benefit is achieved. Placing the sample on the powered electrode is generally preferred because DC bias would not be shunted to ground. Both electrodes may be cooled, e.g., by water.

Plasma, created from the gas within the chamber, is generated and sustained by supplying power (for example, from an RF generator operating at a frequency in the range of 0.001 to 100 MHz) to at least one electrode. The RF power source provides power at a typical frequency in the range of 0.01 to 50 MHz, preferably 13.56 MHz or any whole number (e.g., 1, 2, or 3) multiple thereof. The RF power source can be an RF generator such as a 13.56 MHz oscillator. To obtain efficient power coupling (i.e., wherein the reflected power is a small fraction of the incident power), the power source may be connected to the electrode via a network that acts to match the impedance of the power supply with that of the transmission line (which is usually 50 ohms resistive) so as to effectively transmit RF power through a coaxial transmission line. A description of such networks can be found in Brian Chapman,

*Glow Discharge Processes,* 153 (John Wiley & Sons, New York 1980). One type of matching network, which includes two variable capacitors and an inductor, is available as Model # AMN 3000 from RF Power Products, Kresson, N.J. Traditional methods of power coupling involve the use of a blocking capacitor in the impedance matching network between the powered electrode and the power supply. This blocking capacitor prevents the DC bias voltage from being shunted out to the rest of the electrical circuitry. On the contrary, the DC bias voltage is shunted out to the grounded electrode. While the acceptable frequency range from the RF power source may be high enough to form a large negative DC self bias on the smaller electrode, it should not be so high that it creates standing waves in the resulting plasma, which is inefficient for plasma fluorination.

The articles to be treated may be placed in, or passed through, the evacuable chamber. In some embodiments, a multiplicity of articles may be simultaneously exposed to the plasma during the process of this invention.

In an embodiment in which the article is treated within an ion sheath, plasma fluorination of discrete planar articles can be achieved, for example, by placing the articles in direct contact with the powered electrode. This allows the article to act as an electrode due to capacitive coupling between the powered electrode and the article. This is described in M. M. David, et al., *Plasma Deposition and Etching of Diamond-Like Carbon Films*, AIChE Journal, vol. 37, No. 3, p. 367 (1991). In the case of an elongated article, the article may optionally be pulled through the vacuum chamber continuously, while maintaining contact with an electrode. The result is a continuous plasma fluorination of the elongated article.

FIG. 1 illustrates a parallel plate apparatus 10 suitable for the present invention, showing a grounded chamber 12 from which air is removed by a pumping stack (not shown). Gases to form the plasma are injected radially inward through the reactor wall to an exit pumping port in the center of the chamber. Article 14 is positioned proximate RF-powered electrode 16. Electrode 16 is insulated from chamber 12 by Teflon support 18.

It is not necessary to confine the plasma between the electrodes. The plasma may fill the entire chamber without diminishing the effectiveness of the plasma fluorination. However, the plasma will usually appear brighter between the two electrodes.

Figure 2:
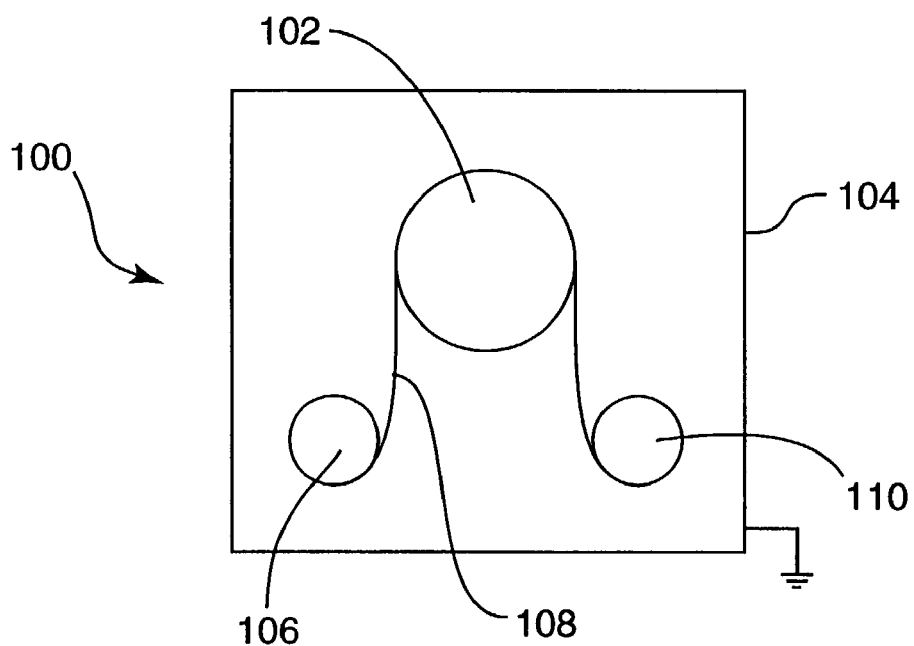
FIG. 2 depicts a single drum plasma apparatus for performing the plasma fluorination of the present invention.

FIG. 2 illustrates single-drum apparatus 100 that is also suitable for the present invention, especially the method embodiment that employs an ion sheath. This apparatus is described in more detail in U.S. Pat. No. 5,948,166. The primary components of apparatus 100 are rotating drum electrode 102 that can be powered by a radio frequency (RF) power source, grounded chamber 104 that acts as a grounded electrode, feed reel 106 that continuously supplies article 108, which is to be treated, and a take-up reel 110, which collects the treated article. A concentric grounded electrode (not shown) can be added near the powered electrode so spacing can be controlled.

Article 108 is a long sheet that, in operation, travels from feed reel 106, around drum electrode 102 and on to take-up reel 110. Reels 106 and 110 are optionally enclosed within chamber 104, or can be outside chamber 104 as long as a low-pressure plasma can be maintained within the chamber.

The curvature of the drum provides intimate contact between the article and the electrode, which ensures that the article remains within the ion sheath, irrespective of other operating conditions such as pressure. This can allow a thick article to be kept within the ion sheath even at high pressures (e.g., 300 to 1000 mTorr). Because the article is supported and carried by the drum, this intimate contact also enables the treatment of delicate materials. The intimate contact also ensures that plasma fluorination is captured by the article, thereby keeping the electrode clean. It also allows for effective single-sided treatment when this is desired. However, dual-sided treatment can be achieved by passing the article through the apparatus twice, with one side being treated per pass. A drum electrode also provides a long treatment zone (pix diameter) and provides symmetric distribution of power across the electrode, which can have operational advantages. The drum may be cooled or heated to control the temperature of the article being treated. In addition, linear dimensions in the direction of current flow are made small in comparison to the wavelength of the RF radiation, eliminating the problem of standing waves.

In other suitable apparatuses, there may be more than one powered electrode and more than one grounded electrode. One suitable apparatus for this invention is a reactor comprising two drum shaped powered electrodes within a grounded reaction chamber, which has two to three times the surface area of the powered electrodes. The drums can be configured so that the article to be treated can travel around and over the two drums in a manner that allows it to be plasma-treated on both sides (one side is treated on each drum). The drums may be located in a single chamber or in separate chambers, or may be in the same chamber, but separated, such that different treatments can occur around each drum.

When multiple electrodes are used, they may be powered by a single RF supply or powered separately. When a single supply is used, the power is sometimes distributed unequally between the electrodes. This may be corrected by using a different power supply for each electrode with oscillator circuits linked to a master power supply through a phase angle adjuster. Thus any power coupling between the electrodes through the plasma may be fine-tuned by adjusting the phase angle between the voltage waveforms of the master and slave power supplies. Flexibility in power coupling and adjustment between the different electrodes may be achieved by this approach.

In some embodiments, it is desirable to have the grounded electrode within about 25 mm of the powered electrode on which an article to be treated is located. Having a grounded electrode close to a powered electrode was found to be advantageous. It resulted in articles with high levels of fluorination and oil repellency. It was further found that, while the proximity of the electrodes provided advantages, it was not necessary that the plasma be restricted to the area between the electrodes. While the plasma glow tended to be brighter between the electrodes, the plasma filled the entire reaction chamber. In addition, one experiment was carried out in which the grounded electrode was perforated to more clearly show that the plasma was not confined. The properties of the resulting article were as good as those of articles produced with an unperforated electrode.

In addition to the capacitive coupling system, the reactor might include other magnetic or electric means such as induction coils, grid electrodes, etc.

Methods of Plasma Fluorination

Other aspects of the invention are further directed to methods of plasma-treating articles. The methods are carried out in a suitable capacitively coupled reactor system such as those described above.

In different embodiments of methods of the present invention, a grounded and a powered electrode are spaced apart by about 25 mm or less, about 16 mm or less, or about 13 mm or less. A low chamber pressure may be used and can be beneficial in some embodiments because the lower pressure normally allows bigger ion sheaths to form. An article to be treated may be placed on the powered electrode (preferably), the grounded electrode, or may be suspended between the electrodes. Plasma fluorination of discrete planar articles can be achieved, for example, by suspending an article between the electrodes, preferably about halfway between the electrodes. In this embodiment, the article may be, but does not need to be, within an ion sheath. If the article is outside of an ion sheath, e.g., by being suspended, a treatment time of over two minutes may be required to deposit a fluorinated layer with good oil repellency properties. However, reducing the space between the electrodes, e.g., to about 16 mm or about 13 mm, can decrease the necessary treatment time. Total treatment times of less than two minutes can be achieved if the article is within an ion sheath.

The article to be treated optionally may be pre-cleaned by methods known to the art to remove contaminants that may interfere with the plasma fluorination. A useful pre-cleaning method is exposure to an oxygen plasma. For this pre-cleaning, pressures in the reactor are maintained between 1.3 Pa (10 mTorr) and 27 Pa (200 mTorr). Plasma is generated with RF power levels of between 500 W and 3000 W. Other gases may be used for pre-cleaning such as, for example, argon, air, nitrogen, hydrogen or ammonia, or mixtures thereof.

Prior to the plasma fluorination process, the chamber is evacuated to the extent necessary to remove air and any impurities. This may be accomplished by vacuum pumps at a pumping stack connected to the chamber. Inert gases (such as argon) may be admitted into the chamber to alter pressure. Once the chamber is evacuated, a source gas containing fluorine is admitted into the chamber via an inlet tube. The source gas is introduced into the chamber at a desired flow rate, which depends on the size of the reactor, the surface area of the electrodes, and the porosity of the articles to be treated. Such flow rates must be sufficient to establish a suitable pressure at which to carry out plasma fluorination, typically 0.13 Pa to 130 Pa (0.001 Torr to 1.0 Torr). For a cylindrical reactor that has an inner diameter of approximately 55 cm and a height of approximately 20 cm, the flow rates are typically from about 50 to about 500 standard cubic centimeters per minute (scem). At the pressures and temperatures of the plasma fluorination (typically 0.13 to 133 Pa (0.001 to 1.0 Torr) (all pressures stated herein are absolute pressures) and less than 50° C.), the source gases remain in their vapor form.

Upon application of an RF electric field to a powered electrode, a plasma is established. In an RF-generated plasma, energy is coupled into the plasma through electrons. The plasma acts as the charge carrier between the electrodes. The plasma can fill the entire reaction chamber and is typically visible as a colored cloud.

The plasma also forms an ion sheath proximate at least one electrode. In an asymmetric electrode configuration, higher self-bias voltage occurs across the smaller electrode. This bias is generally in the range of 100 to 2000 volts. This biasing causes ions within the plasma to accelerate toward the electrode thereby forming an ion sheath. The ion sheath appears as a darker area adjacent to the electrode. Within the ion sheath accelerating ions bombard species being deposited from the plasma onto, and into, the porous article.

The depth of the ion sheath normally ranges from approximately 1 mm (or less) to 50 mm and depends on factors such as the type and concentration of gas used, pressure in the chamber, the spacing between the electrodes, and relative size of the electrodes. For example, reduced pressures will increase the size of the ion sheaths. When the electrodes are different sizes, a larger (i.e., stronger) ion sheath will form adjacent to the smaller electrode. Generally, the larger the difference in electrode size, the larger the difference in the size of the ion sheaths. Also, increasing the voltage across the ion sheath will increase ion bombardment energy.

The article to be treated is placed on or near at least one electrode in the reaction chamber. In the case of an elongated article, the article optionally may be pulled through the vacuum chamber continuously. Contact with an electrode does not need to be maintained. The fluorine species within the plasma react on the article's surface and interior. A suitable plasma could contain fluorine and one or more of oxygen, carbon, sulfur, and hydrogen in various combinations and ratios. The degree of fluorination of the final article may be controlled by a number of factors, for example, the components of the plasma, the length of treatment, and the partial pressure of the plasma components. The plasma fluorination results in species in the plasma becoming randomly attached to the article surface (including interior surfaces) via covalent bonds. The deposited fluorine composition may constitute a full layer over the entire exposed article surface (including interior surfaces), may be more sparsely distributed on the article, or may be deposited as a pattern through a shadow mask.

Sources of fluorine include compounds such as carbon tetrafluoride ($CF_4$), sulfur hexafluoride ($SF_6$), $C_2F_6$, $C_3F_8$, and isomeric forms of $C_4F_{10}$ and $C_5F_{12}$, as well as hexafluoropropylene (HFP) trimer (a mixture of perfluoro 2,3,5 trimethyl 3-hexene; perfluoro 2,3,5-trimethyl 2-hexene; and perfluoro 2,4,5-trimethyl 2-hexene, available from 3M Company).

Other plasma fluorinations might include deposition of amorphous films of containing fluorine such as aluminum fluoride, copper fluoride, fluorinated silicon nitride, silicon oxyfluorides, etc. Furthermore, these might include the attachment of additional functional groups.

For treatments with carbon- or carbon-and-hydrogen-rich plasma fluorinations, hydrocarbons are particularly preferred as sources. Suitable hydrocarbon sources include acetylene, methane, butadiene, benzene, methylcyclopentadiene, pentadiene, styrene, naphthalene, and azulene. Mixtures of these hydrocarbons may also be used. Another source of hydrogen is molecular hydrogen ($H_2$). Sources of oxygen include oxygen gas ($O_2$), hydrogen peroxide ($H_2O_2$), water ($H_2O$), nitrous oxide ($N_2O$), and ozone ($O_3$).

When treatment comprises deposition of a film, it typically occurs at rates ranging from about 1 to 100 nm/second (about 10 to 1000 Angstrom per second (A/sec)), depending on conditions including pressure, power, concentration of gas, types of gases, relative size of electrodes, etc. In general, deposition rates increase with increasing power, pressure, and concentration of gas, but the rates will approach an upper limit.

The articles also may be treated in a manner to provide different degrees of fluorination in different areas of the article. This can be achieved, for example, by using contact masks to selectively expose portions of the porous article to the plasma fluorination. The mask may be attached to the article or may be a separate web that moves with the article. By this method, it is possible to obtain fluorinated areas on an article. The fluorinated areas may be in any shape that can be achieved using a shadow mask, e.g., circles, stripes, etc.

Articles having fluorination gradients may also be produced. This can be achieved by exposing different areas of an article to the plasma fluorination treatment for different lengths of time.

In the foregoing description, certain terms have been used for brevity, clarity, and understanding. No unnecessary limitations are to be implied therefrom beyond the requirement of the prior art because such terms are used for descriptive purposes and are intended to be broadly construed. Moreover, the description and illustration of the invention is by way of example, and the scope of the invention is not limited to the exact details shown or described.

EXAMPLES

This invention may be illustrated by way of the following examples including the described test methods used to evaluate and characterize the plasma fluorinated films produced in the examples.

Plasma Reactor

A parallel-plate capacitively coupled plasma reactor (commercially available as Model 2480 from PlasmaTherm of St. Petersburg, Fla.), typically used for reactive ion etching, was used to carry out plasma treatments. The reactor had a chamber that was cylindrical in shape with an internal diameter of 762 mm (30 inches) and height of 150 mm (6 inches) and a circular powered electrode having a diameter of 686 mm (27 inches) mounted inside the chamber. The powered electrode was attached to a matching network and a 3 kW RF power supply that was operated at a frequency of 13.56 MHz. The chamber was vacuum pumped with a Roots blower backed by a mechanical pump. Unless otherwise stated, the base pressure in the chamber was about 1.3 Pa (10 mTorr) or less. Process gases were metered into the chamber either through mass flow controllers or a needle valve. Pressure was controlled independently from flowrate by a butterfly valve. Unless otherwise stated, all the plasma treatments were done with the sample located on the powered electrode of the plasma reactor. The samples were taped to the electrode or secured with a metal frame.

Hydrocharging

Some samples were hydrocharged before testing. Hydrocharging can enhance filtration performance of an article by imparting a permanent charge. Hydrocharging, as taught in U.S. Pat. No. 5,496,507, which is incorporated herein by reference, imparts a permanent charge onto a media to enhance filtration. This method of hydrocharging comprises impinging jets of water or a stream of water droplets onto the sample at a pressure sufficient to provide the sample with filtration enhancing electret charge. Samples were placed on a mesh belt support and moved at a belt speed of approximately 4 inches/second (10.2 cm/sec) through water jets generated by a pump-assisted water sprayer operating at a water pressure of 827 kPa (6206 Torr). The water jets were positioned about 15 cm (6 in) above the belt. Water was simultaneously removed from the sample by vacuum. Both sides of the samples were treated.

The sample was then passed two additional times over a vacuum to remove additional moisture and then allowed to air-dry overnight before proceeding with testing.

Test Methods

DOP Penetration and Pressure Drop Test

Dioctyl phthalate (DOP) loading is a direct measurement of the resistance of a filter medium to degradation due to exposure to an oily mist aerosol. The penetration through, and the pressure drop across, a sample were monitored during prolonged exposure of the sample to a DOP aerosol under specified conditions. Standard equipment and test procedures were used for measuring filter performance.

The measurements were made using an automated filter tester (AFT) Model 8130 available from TSI Incorporated, St. Paul, Minn. that was set up with an oil aerosol generator. DOP % Penetration was calculated automatically by the AFT instrument.

DOP % Penetration=100(DOP Conc. Downstream/DOP Conc. Upstream), where the concentrations upstream and downstream were measured by light scattering. The DOP aerosol generated by the AFT instrument was nominally monodisperse with a mass median diameter of 0.3 micrometers and had an upstream concentration of 85 mg/m$^3$ to 110 mg/m$^3$ as measured using a gravimetric filter. Measurements were performed with the aerosol neutralizer turned off and a flow rate through the sample of 42.5 liters per minute (L/min), unless otherwise indicated.

Samples were tested in the following manner. Samples were cut and mounted in a sample holder such that an 11.45 cm (4.5 inch) diameter portion of the sample was exposed to the aerosol. The face velocity was 6.9 centimeters/second (cm/sec). Each test was continued until the exposure on the sample was exposed to 200 mg DOP. The DOP % Penetration and corresponding Pressure Drop data were determined by the AFT and transmitted to an attached computer where the data was stored.

Quality Factor

Quality Factor (Q Factor) is a measurement of filtration performance. It depends on the aerosol used, aerosol flow rate, and filter area. The Quality Factor of a sample was calculated by the following formula:

$$\text{Quality Factor } (Q) = -\ln[\% \, DOP \, \text{Penetration}/100]/\text{Pressure Drop}$$

where Q is in inverse mm H$_2$O units and Pressure Drop is in mm H$_2$O units. Q Factors were reported for a DOP penetration loading of 200 mg DOP (Q$_{200}$) at a flow rate of 42.5 L/min and a filter diameter of 11.4 cm resulting in a filter area of 103 cm$^3$.

The higher the Q$_{200}$, the better the filtration performance.

Oil Repellency Test

Porous samples were evaluated for oil repellency using 3M Oil Repellency Test III (February 1994), available from 3M. In this test, samples were challenged to either penetration or droplet-spread by oil or oil mixtures having varying surface tensions. Oils and oil mixtures were given a rating corresponding to the following:

| Oil Repellency Rating Number | Oil Composition | Surface Tension dynes/cm |
|---|---|---|
| 0* | — | — |
| 1 | KAYDOL mineral oil | 31 |
| 2 | 65/35 (vol) mineral oil/n-hexadecane | 28 |
| 3 | n-hexadecane | 26.5 |
| 4 | n-tetradecane | 25.5 |
| 5 | n-dodecane | 24 |
| 6 | n-decane | 22 |
| 7 | n-octane | 20.5 |
| 8 | n-heptane | 18.5 |

*fails KAYDOL mineral oil

In running the Oil Repellency Test, a porous sample was placed on a flat, horizontal surface. A small drop of oil composition was gently placed on the sample. If, after ten seconds it was observed that the drop was visible as a sphere or a hemisphere, the porous sample is deemed to pass the test. The reported oil repellency rating of the sample corresponds to the highest numbered oil or oil mixture that was repelled.

It was desirable to have an oil repellency rating of at least 1, preferably at least 3.

Fluorine Content

A sample size of about 1 to 3 mg was loaded into an Antek 9000F Fluoride Analysis System available from Antek Instruments, Houston, Tex. The analysis was based on oxypyrohydrolysis followed by final analysis with a fluoride ion specific electrode (ISE). The carbon-fluorine bond was oxypyrohydrolyzed at 1050° C. The product hydrogen fluoride (HF) is trapped in a buffer solution. The dissociated fluoride ions were measured with fluoride ISE at a controlled temperature. The calibration curve was based on standards prepared with FC-143 ($C_7F_{15}CO_2NH_4$) in the range of 25 ppm fluorine to 1000 ppm fluorine at an injection of from 10 to 15 µL.

Example 1

This example illustrates the effect of the combination of an ion sheath and electrode spacing on Quality Factor (Q-Factor).

A blown microfiber porous article was made from propylene (available as EOD97-13 from ATOFINA Petrochemical, Houston, Tex.) that was extruded at a temperature of 350° C. and blown horizontally onto a collector at a distance of about 300 mm (12 in) from the extruder. The resulting porous article had an effective fiber diameter 7.5 µm as described in C. N. Davies, "Air Filtration" Academic Press, 1973. It also had a solidity of 7.7%, a basis weight of 87.5 g/m², an effective pore diameter of 25 µm, and a thickness of about 1.24 mm (49 mils). Web thickness was measured according to ASTM D1777-64 using a 230 g weight on a 10 cm diameter disk. In DOP Penetration testing at 42.5 L/min flow of DOP aerosol, the article exhibited a pressure drop of 40 Pa (300 mTorr).

The porous article was cut into rectangles of about 15 cm×30 cm used as samples A to R. The samples were treated on the powered electrode in the Plasma Reactor with plasma formed from perfluoropropane ($C_3F_8$) gas available from 3M Company and with various electrode separation distances and process conditions as shown in Table 1. The reactor chamber was pumped down to a base pressure of less than 1.3 Pa (10 mTorr). $C_3F_8$ was introduced into the chamber at a flow rate of 100 or 200 sccm. Chamber pressure and radio frequency (RF) power were established. A bright plasma was seen in the inter-electrode space and an ion sheath, which was darker than the plasma, formed adjacent to the powered electrode and encompassed the porous article. For each sample the plasma treatment was continued for one minute. Then the plasma was extinguished, the gas flow was stopped, the chamber pressure brought down to below 1.3 Pa (10 mTorr), and the chamber was vented to atmosphere. The sample was flipped over and the treatment was repeated on the other side.

Samples were hydrocharged and measured for DOP penetration. The DOP Penetration Test was run as described in the Test Method section above except the flow rate was 85 L/min and the neutralizer was on. Quality Factors, $Q_{200}$, are reported in Table 1.

TABLE 1

| Sample | Spacing (mm) | Power (W) | Pressure (Pa) | Flow (sccm) | $Q_{200}$ (at 85 L/min) |
|---|---|---|---|---|---|
| 1-A | 152 | 1500 | 37 | 100 | 0.398 |
| 1-B | 152 | 1000 | 67 | 200 | 0.086 |
| 1-C | 152 | 2000 | 67 | 200 | 0.120 |
| 1-D | 152 | 1000 | 13 | 100 | 0.441 |
| 1-E | 152 | 2000 | 13 | 100 | 0.335 |
| 1-F | 152 | 1500 | 37 | 100 | 0.309 |
| 1-G | 76 | 1500 | 37 | 100 | 0.358 |
| 1-H | 76 | 1000 | 67 | 200 | 0.094 |
| 1-I | 76 | 2000 | 67 | 200 | 0.124 |
| 1-J | 76 | 1000 | 13 | 100 | 0.445 |
| 1-K | 76 | 2000 | 13 | 100 | 0.422 |
| 1-L | 76 | 1500 | 40 | 100 | 0.428 |
| 1-M | 25 | 1500 | 37 | 100 | 0.574 |
| 1-N | 25 | 1000 | 67 | 200 | 0.376 |
| 1-O | 25 | 2000 | 67 | 200 | 0.556 |
| 1-P | 25 | 1000 | 13 | 100 | 0.582 |
| 1-Q | 25 | 2000 | 13 | 100 | * |
| 1-R | 25 | 1500 | 40 | 100 | 0.570 |

* This condition did not run with a stable plasma.
The benefit of reducing the electrode spacing was clearly seen in the $Q_{200}$ values shown above.

Example 2 and Comparative Example 1

This example illustrates the effect of reduced electrode distance on Quality Factor at the standard test conditions (i.e., 42 L/min and neutralizer off).

Example 2 was made as Example 1-D except a different electrode distance, chamber pressure, and standard test conditions were used as described herein. The electrode spacing was 0.625 in (16 mm) and chamber pressure was at 6.7 Pa (50 mTorr). The sample was exposed to the plasma for two minutes on each side. The sample was measured for Oil Repellency. The Oil Repellency Rating was 5. The sample was also hydrocharged and measured for DOP penetration. $Q_{200}$ for this sample was 1.53.

Comparative Example 1 was made as Example 2 (except the electrode spacing was 76 mm). The sample was hydrocharged and measured for DOP penetration. $Q_{200}$ for this sample was 0.58.

The results show that decreasing the electrode spacing provides improved $Q_{200}$ qualities.

Example 3 and Comparative Example 2

This example illustrates the effect of plasma fluorination within an ion sheath on the oil-repellency characteristics of a porous article.

Example 3 was made as Example 1-D except a different electrode distance, chamber pressure, and standard test conditions were used as described herein. The electrode spacing was 0.625 in (16 mm) and chamber pressure was at 16.6 Pa (125 mTorr). The sample was exposed to the plasma for one minute on each side.

Comparative Example 2 was made in a manner similar to Example 3 except the porous article was suspended in the plasma between the powered electrode and the grounded electrode and about 8 mm from either electrode and thus outside the ion sheath. Because a plasma existed on both sides of the suspended sample, the sample did not have to be flipped over. Total treatment time was two minutes.

Example 3 and Comparative Example 1 were measured for oil repellency. The Oil Repellency Rating for Example 3 and Comparative Example 1 were 5 and 4, respectively. The samples were also hydrocharged and measured for DOP penetration. Quality Factors were determined at different amounts of DOP penetration. The results are shown in Table 2.

TABLE 2

| DOP Penetration | Quality Factor | |
| --- | --- | --- |
| | Example 3 | Comp. Example 2 |
| 0 | 2.59 | 1.52 |
| 20 | 2.30 | 1.22 |
| 40 | 2.10 | 1.02 |
| 60 | 1.93 | 0.84 |
| 80 | 1.83 | 0.73 |
| 100 | 1.72 | 0.62 |
| 120 | 1.61 | 0.54 |
| 140 | 1.51 | 0.46 |
| 160 | 1.44 | 0.40 |
| 180 | 1.37 | 0.35 |
| 200 | 1.28 | 0.23 |

As seen in the above table, the Quality Factor at 200 mg of DOP loading was 1.28 for Example 3. In contrast, the quality factor of Comparative Example 2 was 0.23. The Q Factor results indicate that plasma fluorination of a porous sample within an ion sheath was more efficient than plasma fluorination outside an ion sheath.

Example 4 and Comparative Example 3

The example illustrates the effect of exposure time and electrode distance on a porous article treated outside of an ion sheath.

Example 4 was made as Comparative Example 2 except the total treatment time for the sample was 4 minutes. The resulting sample had an Oil Repellency Rating of 4. The sample was hydrocharged and measured for DOP Penetration. A $Q_{200}$ value of 1.28 was obtained.

Comparative Example 3 was made as Example 4. It was made outside an ion sheath with an electrode spacing of 76 mm and for a total treatment time of 4 minutes. The sample was hydrocharged and measured for DOP penetration. A $Q_{200}$ value of 0.48 was obtained.

Example 5

This example illustrates the effect of plasma fluorination on the oil-repellency of a porous membrane having small pores.

Example 5 was made as Example 1-D except the porous article was different and and electrode spacing and chamber pressure were changed. The porous article was a microporous polyethylene membrane made according to U.S. Pat. No. 4,539,256 Ex 8 except the film was stretched to 6 times its original length in one direction. The membrane had pore diameters of about 0.09 micrometer. The electrode distance was about 16 mm (0.625 in) and the chamber pressure was 67 Pa (500 mTorr). The sample was exposed to the plasma for about one minute on each side. The resulting treated sample had an Oil Repellency Rating of 4. The Oil Repellency Rating of the untreated sample was 0.

Example 6

This example illustrates the effect of short exposure times on the oleophobicity of a porous article.

Example 6 was made as Example 1-D except the electrode distance was 16 mm, the chamber pressure was 67 Pa (500 mTorr), the total exposure times were less than 60 seconds, and the conditions shown in Table 4 were used. The repellency rating of the untreated sample was 0.

Both samples were tested for oil repellency and DOP penetration. Results are shown in Table 3.

TABLE 3

| Sample | Total Time (sec) | Power (W) | Pressure (Pa) | Flow (sccm) | Repel. Rating | $Q_{200}$ |
| --- | --- | --- | --- | --- | --- | --- |
| 6-A | 20 | 1000 | 67 | 100 | 5 | 1.17 |
| 6-B | 10 | 1000 | 67 | 100 | 4 | 0.80 |

As shown above, $Q_{200}$ was over 1.1 at treatment time of 20 seconds.

Example 7

This example shows the effect of treatment time and proximity to an ion sheath on treatment effect.

The samples each consisted of a four-layer stack of the polypropylene blown microfiber webs. Each layer was made from polypropylene (available as EOD97-13 from ATOFINA Petrochemical) that was extruded at a temperature of 330° C. with a collector distance of about 300 mm (12 in). The resulting web had an effective fiber diameter of 7.0 μm, pressure drop of 5.9 Pa (44 mTorr), a solidity of 4.7%, a basis weight of 15 g/m² and thickness of about 340 μm (13.5 mils). Each sample stack was treated with a $C_3F_8$ plasma in a manner similar to Example 1 but at various exposure times and with an electrode separation distance of 16 mm (0.625 in). Two samples were made at each of three different exposure times, 20 seconds, 120 seconds, and 240 seconds. For each exposure time, one four-layer sample was positioned on the lower, powered electrode (within an ion sheath) and a second four-layer sample was simultaneously positioned approximately midway between the powered and grounded electrodes (outside an ion sheath), which were 16 mm apart. Both the samples on the powered electrode and the suspended samples were flipped over midway through the treatment. For all samples, the treatment conditions were 100 sccm $C_3F_8$, 40 mPa (300 mTorr), and 1000 Watts applied RF power.

Each sample was analyzed for fluorine content in each of the four layers. Exposure times, sample position during treatment, and results are shown in Table 4.

TABLE 4

| | | | Fluorine Content in ppm | | | |
| --- | --- | --- | --- | --- | --- | --- |
| Sample | Total time (sec) | Position | $1^{st}$ Layer | $2^{nd}$ Layer | $3^{rd}$ Layer | $4^{th}$ Layer |
| 7-A | 20 | Suspended | 45 | Under 5 | Under 5 | 17 |
| 7-B | 20 | electrode | 3828 | 1249 | 847 | 2601 |
| 7-C | 120 | Suspended | 70 | 41 | 40 | 137 |
| 7-D | 120 | electrode | 9148 | 4732 | 3834 | 6872 |
| 7-E | 240 | Suspended | 146 | 86 | 95 | 147 |
| 7-F | 240 | electrode | 10475 | 5539 | 4826 | 7598 |

As seen in the above table, the concentration of fluorine in each of the four layers of a sample was substantially more for the samples within an ion sheath than for those outside the ion sheath.

Example 8

This example illustrates the effect of a perforated electrode on the plasma treatment.

Example 8 was made as Example 2 except the grounded electrode had holes with diameters of 4.8 mm (0.188 inches) and center-to-center spacings of 6.4 mm (0.250 inches), and the chamber pressure was 67 Pa (500 mTorr). A bright plasma was seen everywhere in the chamber including the regions on the side of the perforated grounded electrode opposite the side facing the powered electrode.

Example 8 was tested for oil repellency. The Oil Repellency Rating was 5. This shows that a perforated electrode, which allowed the plasma to fill the entire chamber more easily than with a standard electrode, had no detrimental effect on the properties of the resulting article.

Example 9 and Comparative Examples 4 and 5

This example illustrates the influence of electrode spacing on the fluorination of porous and non-porous substrates at comparable volumetric power densities.

Samples of Example 9 were made in a manner similar to that of Example 1-D except the distance between electrodes was varied, and conditions were changed as described herein. The fluorination treatment was carried out for a treatment time of 10 seconds with the $C_3F_8$ gas flow rate maintained at 100 sccm and the chamber pressure maintained at 67 Pa (0.500 Torr). Samples A and B were flipped over and additionally treated on the backside of the article for another 10 seconds for a total exposure time of 20 seconds. RF power was adjusted to nominally maintain the same power density per unit volume of space between the two electrodes for the different electrode distances. The power density for Sample A was 0.171 $W/cm^3$. The power density for Sample B was 0.179 $W/cm^3$.

Comparative Examples 4 and 5 were made as in Sample A and B, respectively, except the substrate for the Comparative Examples was a 0.18 mm thick polycarbonate non-porous film and the Comparative Examples were not flipped over during plasma treatment, so the total exposure time was only 10 seconds on one side. The oil repellency of the untreated non-porous films was 0.

Samples were tested for oil repellency. The varied process conditions and results are shown in Table 5.

TABLE 5

| Sample | Substrate Type | Distance (mm) | Time (sec) | Power (W) | Repel. Rating |
| --- | --- | --- | --- | --- | --- |
| 9-A | porous | 16.0 | 20 | 1000 | 5 |
| 9-B | porous | 28.5 | 20 | 1900 | 2 |
| CE-4 | non-porous | 16.0 | 10 | 1000 | 6 |
| CE-5 | non-porous | 28.5 | 10 | 1900 | 6 |

As seen in Table 5, the results obtained for the porous substrates were drastically different depending upon the electrode spacing. The porous article made with an electrode spacing of 16 mm withstood a No. 5 fluid in the Oil Repellency Test whereas the porous article made with an electrode spacing of 28.5 mm withstood only a No. 2 fluid. In contrast, non-porous samples were not affected by the electrode spacing.

Example 10

In order to understand the effect of deposition rate of the fluorocarbon on a porous sample, the treatment conditions used to make Samples 9-A and 9-B were repeated on Samples 10-A and 10-B, respectively. The substrates for samples 10-A and 10-B were pieces of silicon over which a polystyrene film had been spin-coated. Portions of the substrates were masked with tape to allow for step-height measurements using a stylus profilometer available as Alpha-Step 500 from Tencor Instruments, Mountainview, Calif. The samples were not flipped over. Total exposure time was 120 seconds, chamber pressure was 67 Pa (500 mTorr) and gas flow rate was 100 sccm. Power was varied as described above to maintain comparable power densities.

Samples were tested for oil repellency. The process conditions and deposition rate results are shown in Table 6.

TABLE 6

| Sample | Time (sec) | Power (W) | Distance (mm) | Flow (sccm) | Deposition Rate (nm/s) |
| --- | --- | --- | --- | --- | --- |
| 10-A | 120 | 1000 | 16 | 100 | 2.16 |
| 10-B | 120 | 1900 | 28 | 100 | 2.27 |

The measured deposition rate of 2.16 nanometers/second for sample 10-A was nominally the same as the rate of 2.27 nanometers/second for sample 10-B. Thus the superior repellency performance of Sample 9-A over Sample 9-B was not due to a higher deposition rate and thicker film. This illustrates that the superior article properties provided by the invention are not due to depositing thicker fluorinated layers, but are due to more efficient plasma fluorination of article interiors.

Example 11

This example illustrates the benefit of locating the porous substrate on the powered electrode for short treatment times.

Samples for Example 11 were made as in Example 1-D except the electrode separation distance was 16 mm (0.625 in) and some process conditions were different as described herein. Sample A was located on the powered electrode whereas sample B was located on the grounded electrode. Both samples were secured to the electrode with removable Scotch tape on the edges. Fluorination was done at a chamber pressure of 67 Pa(500 mTorr) with a $C_3F_8$ flow rate of 100 sccm, and RF power maintained at 1000 W. Both the samples were treated for 10 seconds, then flipped over and treated on the opposite side for another 10 seconds for a total treatment time of 20 seconds.

The samples were tested for oil repellency and the results are summarized in Table 7.

TABLE 7

| Sample | Substrate Location | Electrode Spacing (mm) | Time (sec) | Power (W) | Repel. Rating |
| --- | --- | --- | --- | --- | --- |
| 11-A | Powered Electrode | 16.0 | 20 | 1000 | 5 |
| 11-B | Grounded Electrode | 16.0 | 20 | 1000 | 2 |

As seen in the table, the oil repellency rating of the sample located on the powered electrode was significantly better than the sample located on the grounded electrode.

Example 12

This example demonstrates the efficacy of the fluorination process when the electrode spacing is less than 12 mm (0.5 in). Stable plasma operation is generally not possible with such a small spacing. By operating the $C_3F_8$ plasma at a pressure of 67 Pa (500 mTorr) and power of 1000 Watts, a surprisingly stable plasma was obtained even when the electrode spacing was as low as 6.3 mm (0.25 in). Samples for Example 12 were made as in Example 1-D except the electrode separation distance was 8.6 mm (0.340 in) for sample 12-A and 6.3 mm (0.25 in) for samples 12-B and 12-C. Fluorination was done at a chamber pressure of 67 Pa (500 mTorr) with a $C_3F_8$ flow rate of 100 sccm, and RF power maintained at 1000 W. Samples 12-A and 12-B were treated for 10 seconds, then flipped over and treated on the opposite side for another 10 seconds for a total treatment time of 20 seconds. Sample 12-C was treated in the same manner using the same process conditions but the treatment time was for 5 seconds per side, a total treatment time of 10 seconds. The Oil Repellency Ratings of these samples are summarized in Table 8.

TABLE 8

| Sample | Substrate Location | Electrode Spacing (mm) | Time (sec) | Power (W) | Repel. Rating |
|---|---|---|---|---|---|
| 12-A | Powered Electrode | 8.6 | 20 | 1000 | 5 |
| 12-B | Powered Electrode | 6.3 | 20 | 1000 | 5 |
| 12-C | Powered Electrode | 6.3 | 10 | 1000 | 5 |

As can be seen from the data, the Repellency Rating is excellent even when the treatment times are as small as 10 seconds.

Example 13

This example demonstrates the effect of treating a porous article on the grounded electrode with a small electrode spacing.

Samples of the web described in Example 1 were plasma fluorinated at a $C_3F_8$ flow rate of 83 sccm, a chamber pressure of 40 Pa (300 mTorr), RF power maintained at 1000 Watts, and an electrode spacing of 16 mm. Sample 13-A was placed in the ion sheath adjacent to the powered electrode while sample 13-B was placed in the ion sheath adjacent to the grounded electrode. The samples were hydrocharged and tested for DOP penetration using the standard test method. $Q_{200}$ for Example 13-A was 1.24. $Q_{200}$ for Example 13-B was 1.06.

Various modifications and alterations of this invention will become apparent to those skilled in the art without departing from the scope and spirit of this invention and it should be understood that this invention is not to be unduly limited to the illustrative embodiments set forth herein.

What is claimed is:

1. A method of fluorinating a porous article comprising:
providing a reaction chamber containing a capacitively-coupled system comprising at least one grounded electrode and at least one drum electrode powered by an RF source separated from the grounded electrode by less than 25 millimeters; generating a fluorine-containing plasma in the chamber thereby causing an ion sheath to form adjacent to the electrodes;
placing a porous article in the ion sheath of the powered electrode such that the porous article is in contact with the at least one drum electrode; and
allowing reactive species from the plasma to react with the article surface and interior whereby the article becomes fluorinated;
wherein the grounded electrode is substantially parallel to the surface of the powered electrode and the porous article is positioned between the electrodes.

2. The method of claim 1 wherein the article has pores that are smaller than the mean free path of any species in the plasma.

3. The method of claim 1 wherein the porous article is substantially continuous.

4. The method of claim 1 wherein the reactive species from the plasma reacts with the article surface and interior for less than 60 seconds.

5. The method of claim 1 wherein the porous article is selected from the group consisting of foams, woven materials, nonwoven materials, membranes, frits, porous fibers, textiles, and microporous articles.

6. The method of claim 1 wherein the article has two parallel major surfaces and is plasma treated on one major surface by allowing reactive species from the plasma to react with the article surface and interior, whereby the article becomes fluorinated.

7. The method of claim 6 wherein the article is further plasma treated on its second major surface by allowing reactive species from the plasma to react with the second major surface and interior, whereby the second major surface of the article becomes fluorinated.

8. The method of claim 1 where the electrodes are separated by about 16 millimeters or less.

9. A method of fluorinating a porous article comprising:
providing a reaction chamber containing a capacitively-coupled system comprising at least one drum electrode powered by an RF source and at least one grounded electrode that is substantially parallel to the surface of the powered drum electrode and separated from the grounded electrode by about 25 millimeters or less; generating a fluorine-containing plasma in the chamber at a pressure of about 40 Pascal or less;
placing a porous article between the substantially parallel electrodes such that the porous article is in contact with the at least one drum electrode; and
allowing reactive species from the plasma to react with the article surface and interior for a total treatment time of over two minutes whereby the article becomes fluorinated.

10. A method of fluorinating a porous article comprising:
providing a reaction chamber containing a capacitively-coupled system comprising at least one drum electrode powered by an RF source operated at a frequency of 13.56 MHz and at least one grounded electrode that is substantially parallel to the surface of the powered electrode and separated from the grounded electrode by about 13 millimeters or less;
generating a fluorine-containing plasma in the chamber thereby causing an ion sheath to form adjacent to the electrodes;
placing a porous article between the electrodes such that the porous article is in contact with the at least one drum electrode; and
allowing reactive species from the plasma to react with the article surface and interior whereby the article becomes fluorinated.

* * * * *

UNITED STATES PATENT AND TRADEMARK OFFICE
CERTIFICATE OF CORRECTION

| | | |
|---|---|---|
| PATENT NO. | : 7,887,889 B2 | Page 1 of 1 |
| APPLICATION NO. | : 10/293830 | |
| DATED | : February 15, 2011 | |
| INVENTOR(S) | : Moses M David | |

It is certified that error appears in the above-identified patent and that said Letters Patent is hereby corrected as shown below:

<u>Cover Page, (75) Inventors</u>
Delete "Minnepolis," and insert -- Minneapolis, -- therefore.

<u>Column 8</u>
Line 9, delete "(pix" and insert -- (pi x -- therefore.

<u>Column 9</u>
Line 42, delete "(scem)." and insert -- (sccm). -- therefore.

<u>Column 12</u>
Line 39, delete "103 cm$^3$." and insert -- 103 cm$^2$. -- therefore.

<u>Column 15</u>
Line 30, delete "The" and insert -- This -- therefore.
Line 50, after "and" delete "and".

<u>Column 16</u>
Line 41, delete "seem" and insert -- sccm -- therefore.

<u>Column 20</u>
Line 12, in claim 4, delete "the-reactive" and insert -- the reactive -- therefore.

Signed and Sealed this
Third Day of May, 2011

David J. Kappos
*Director of the United States Patent and Trademark Office*